United States Patent
Tian

(10) Patent No.: US 10,084,021 B2
(45) Date of Patent: Sep. 25, 2018

(54) PIXEL ARRANGEMENT STRUCTURE AND A DISPLAY APPARATUS

(71) Applicant: Wuhan China Star Optoelectronics Technology Co., Ltd., Wuhan, Hubei (CN)

(72) Inventor: Nian Tian, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 89 days.

(21) Appl. No.: 15/328,140

(22) PCT Filed: Dec. 27, 2016

(86) PCT No.: PCT/CN2016/112304
§ 371 (c)(1),
(2) Date: Jan. 23, 2017

(87) PCT Pub. No.: WO2018/094802
PCT Pub. Date: May 31, 2018

(65) Prior Publication Data
US 2018/0211999 A1 Jul. 26, 2018

(30) Foreign Application Priority Data
Nov. 28, 2016 (CN) .......................... 2016 1 10648895

(51) Int. Cl.
*H01L 27/32* (2006.01)
*G09G 3/3208* (2016.01)

(52) U.S. Cl.
CPC ....... *H01L 27/3213* (2013.01); *G09G 3/3208* (2013.01); *G09G 2300/0452* (2013.01)

(58) Field of Classification Search
CPC .............. H01L 27/321; H01L 27/3213; H01L 27/3216; H01L 27/3218; G09G 3/3208; G09G 3/3607; G09G 2300/0452
See application file for complete search history.

(56) References Cited

U.S. PATENT DOCUMENTS

2007/0024183 A1   2/2007  Lih et al.
2016/0041434 A1*  2/2016  Qin .................. G02F 1/134309
                                                          345/694
(Continued)

FOREIGN PATENT DOCUMENTS

CN        102386208 A    3/2012
CN        102426821 A    4/2012
(Continued)

*Primary Examiner* — Phuc Dang
(74) *Attorney, Agent, or Firm* — Andrew C. Cheng

(57) ABSTRACT

The present application discloses a pixel arrangement structure and a display apparatus, the pixel arrangement structure includes a plurality of pixel units, the pixel unit includes a first sub-pixel group, a common sub-pixel group, and a second sub-pixel group sequentially arranged in row direction, the first sub-pixel group includes a first red sub-pixel and a first green sub-pixel arranged in a column direction, the common sub-pixel group includes a dark blue sub-pixel and a light blue sub-pixel arranged in a column direction, the second sub-pixel group includes a second red sub-pixel and a second green sub-pixel arranged in a column direction, the first sub-pixel group and the common sub-pixel group form a first pixel, and the second sub-pixel group and the common sub-pixel group form a second pixel. The present application can increase the density of the sub-pixel arrangement, thereby increasing the resolution of the display apparatus.

10 Claims, 2 Drawing Sheets

(56) References Cited

U.S. PATENT DOCUMENTS

| | | | |
|---|---|---|---|
| 2016/0126296 A1* | 5/2016 | Feng | H01L 27/3218 257/40 |
| 2016/0196777 A1* | 7/2016 | Liu | G09G 3/2003 345/694 |
| 2016/0240594 A1* | 8/2016 | Zhu | H01L 27/3218 |

FOREIGN PATENT DOCUMENTS

| | | |
|---|---|---|
| CN | 102714214 A | 10/2012 |
| CN | 104820312 A | 8/2015 |

* cited by examiner

PIXEL ARRANGEMENT STRUCTURE AND A DISPLAY APPARATUS

CROSS REFERENCE

This application claims priority to Chinese Patent Application No. 201611064889.5, entitled "PIXEL ARRANGEMENT STRUCTURE AND A DISPLAY APPARATUS", filed on Nov. 28, 2016, which is incorporated by reference in its entirety.

FIELD OF THE INVENTION

The present application relates to a display technology field, and more particularly to a light-emitting diode pixel arrangement structure, and a display apparatus including the light-emitting diode pixel arrangement structure.

BACKGROUND OF THE INVENTION

Organic Light-Emitting Diode (OLED) displays have many advantages, such as thinness, active luminescence, fast response, large viewing angle, wide color gamut, high brightness and low power consumption, and are becoming the third generation display technology after liquid crystal display. In OLED display apparatus, however, the lifetime of the blue-emitting devices, especially dark blue devices, is much shorter than that of red and green devices. Thus, during the use of the OLED display, with the decay of the Blue light period, the display image will become yellow, thus significantly shortening the effective life of the entire display.

Referring to FIG. 1, in the conventional technology, a red (R), a green (G) sub-pixel are used in combination with two blue sub-pixel (dark blue B1, light blue B2) to form a pixel structure 11, and by reducing the use time of the dark blue sub-pixel to extend its lifetime. However, each pixel in this pixel structure includes four sub-pixel, which reduces the density of the sub-pixel arrangement under the same manufacturing process conditions and reduces the resolution of the display apparatus.

SUMMARY OF THE INVENTION

The object of the present invention is to provide a pixel arrangement structure which can improve the resolution of a display apparatus on the basis of an increase in the lifetime of the display apparatus.

Another object of the present invention is to provide a display apparatus employing the above described pixel arrangement structure.

In order to achieve the above-mentioned object, the present invention provides the following technical solutions:

The present application provides a pixel arrangement structure includes a plurality of pixel units, the pixel units include a first sub-pixel group, a common sub-pixel group, and a second sub-pixel group sequentially arranged in row direction, the first sub-pixel group including a first red sub-pixel and a first green sub-pixel arranged in a column direction, the common sub-pixel group including a dark blue sub-pixel and a light blue sub-pixel arranged in a column direction, the second sub-pixel group including a second red sub-pixel and a second green sub-pixel arranged in a column direction, the first sub-pixel group and the common sub-pixel group form a first pixel, and the second sub-pixel group and the common sub-pixel group form a second pixel.

Wherein one selected from two of the dark blue sub-pixel and the light blue sub-pixel, and the first sub-pixel group are turned on for displaying the first pixel; one of the dark blue sub-pixel, the light blue sub-pixel and the second sub-pixel group are turned on for displaying the second pixel.

Wherein the dark blue sub-pixel, the first sub-pixel group and the second sub-pixel group are turned on for displaying the first pixel and the second pixel, wherein the luminance of the dark blue sub-pixel is a reference value.

Wherein the light blue sub-pixel, the first sub-pixel group and the second sub-pixel group are turned on for displaying the first pixel and the second pixel, wherein the luminance of the light blue sub-pixel is a reference value.

Wherein the first red sub-pixel and the second red sub-pixel are located on the same row.

Wherein the first red sub-pixel and the second green sub-pixel are located on the same row.

The present application provides a display apparatus including a plurality of pixel units, the pixel units including a first sub-pixel group, a common sub-pixel group, and a second sub-pixel group sequentially arranged in row direction, the first sub-pixel group including a first red sub-pixel and a first green sub-pixel arranged in a column direction, the common sub-pixel group including a dark blue sub-pixel and a light blue sub-pixel arranged in a column direction, the second sub-pixel group including a second red sub-pixel and a second green sub-pixel arranged in a column direction, the first sub-pixel group and the common sub-pixel group form a first pixel, and the second sub-pixel group and the common sub-pixel group form a second pixel.

Wherein one selected from two of the dark blue sub-pixel and the light blue sub-pixel, and the first sub-pixel group are turned on for displaying the first pixel; one of the dark blue sub-pixel, the light blue sub-pixel and the second sub-pixel group are turned on for displaying the second pixel.

Wherein the dark blue sub-pixel, the first sub-pixel group and the second sub-pixel group are turned on for displaying the first pixel and the second pixel, wherein the luminance of the dark blue sub-pixel is a reference value.

Wherein the light blue sub-pixel, the first sub-pixel group and the second sub-pixel group are turned on for displaying the first pixel and the second pixel, wherein the luminance of the light blue sub-pixel is a reference value.

The embodiment of the present application has the following advantages or beneficial effect:

In the embodiment of the present invention, each pixel unit includes the first sub-pixel group, the common sub-pixel group and the second sub-pixel group sequentially arranged in row direction, the common sub-pixel group includes the dark blue sub-pixel and the light blue sub-pixel, by decreasing the using time of the dark blue sub-pixel to extend the lifetime while increasing the color gamut of the display apparatus; in addition, two pixels in the same pixel unit share a set of common sub-pixel group, which can increase the density of the sub-pixel arrangement, thereby increasing the resolution of the display apparatus.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention. Embodiments and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 2:
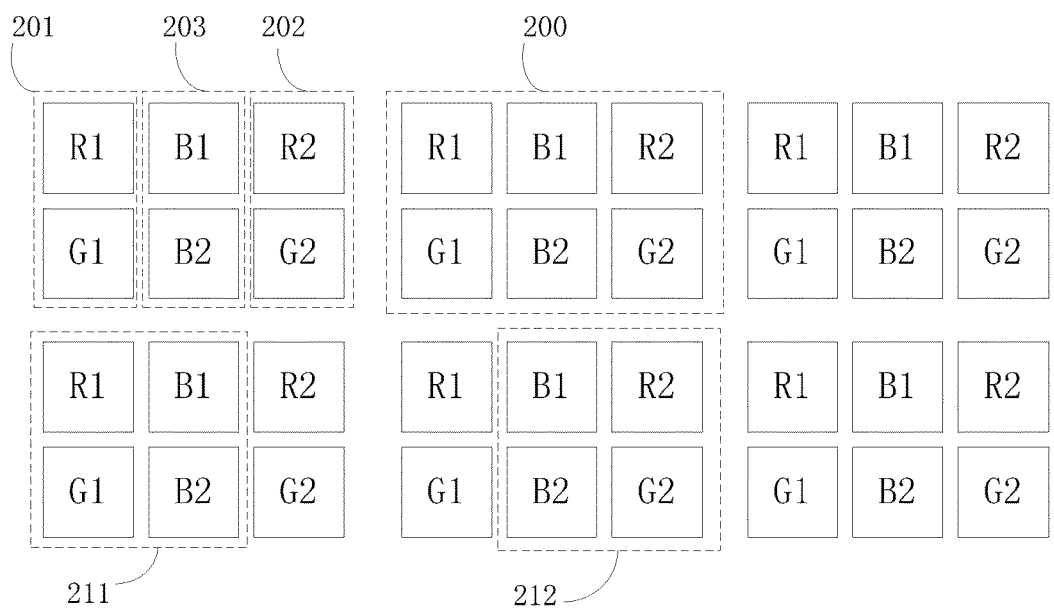
FIG. 2 is a schematic diagram of a pixel arrangement structure according to an embodiment of the present invention.

It is to be noted here that in order to avoid obscuring the present invention with unnecessary detail, only the structure and/or processing steps closely related to the approach according to the invention are illustrated in the accompanying drawings, other details of the present invention not closed to the present application is omitted. Referring to FIG. 2, FIG. 2 is a schematic view of a pixel arrangement structure provided by an embodiment of the present invention. The pixel arrangement structure of the present invention includes a plurality of pixel units 200, the pixel units 200 includes a first sub-pixel group 201, a common sub-pixel group 203, and a second sub-pixel group 202 sequentially arranged in row direction. The first sub-pixel group 201 includes a first red sub-pixel R1 and a first green sub-pixel G1 arranged in a column direction. The common sub-pixel group 203 includes a dark blue sub-pixel B1 and a light blue sub-pixel B2 arranged in a column direction. The dark blue sub-pixel B1 and the light blue sub-pixel B2 can increase the color gamut of the display apparatus. The second sub-pixel group 203 includes a second red sub-pixel R2 and a second green sub-pixel G2 arranged in a column direction.

The first sub-pixel group 201 and the common sub-pixel group 203 form a first pixel 211, and the second sub-pixel group 202 and the common sub-pixel group 203 form a second pixel 212. In other words, the pixel unit 200 includes a first pixel 211 and a second pixel 212. Wherein the first pixel 211 and the second pixel 212 share a common sub-pixel group 203.

In the embodiment of the present invention, each pixel unit includes the first sub-pixel group, the common sub-pixel group and the second sub-pixel group sequentially arranged in row direction, the common sub-pixel group includes the dark blue sub-pixel and the light blue sub-pixel, by decreasing the using time of the dark blue sub-pixel, thereby extending the lifetime while increasing the color gamut of the display apparatus; in addition, two pixels in the same pixel unit share a set of common sub-pixel group, which can increase the density of the sub-pixel arrangement, thereby increasing the resolution of the display apparatus.

In a specific embodiment of the present invention, when the first pixel 211 and the second pixel 212 display an image, in the same pixel, only one of the dark blue sub-pixel B1 and the light blue sub-pixel B2 is turned on for displaying the image. In other words, one of the dark blue sub-pixel B1 and the light blue sub-pixel B2 and the first sub-pixel group 201 are turned on for displaying the first pixel 211; one of the dark blue sub-pixel B1 and the light blue sub-pixel B2 and the second sub-pixel group 202 are turned on for displaying the second pixel 212. For example, when the first pixel 211 requires the color of light blue sub-pixel B2, and the second pixel 212 requires the color of dark blue sub-pixel B1, the first red sub-pixel R1, the first green sub-pixel G1, and the light blue sub-pixel B2 are turned on for displaying the first pixel 211. The second red sub-pixel R2, the second green sub-pixel G2, and the dark blue sub-pixel B1 are turned on for displaying the second pixel 212.

In a specific embodiment of the invention, the first pixel 211 and the second pixel 212 display an image, and when the first pixel 211 and the second pixel 212 share one sub-pixel in the common sub-pixel group 203 (the dark sub-pixel B1 or the light blue sub-pixel B2), the luminance of the shared common sub-pixel group is the average value of the luminance of the sub-pixel in the first pixel 211 and the luminance of the sub-pixel in the second pixel 212. For example, when both the first pixel 211 and the second pixel 212 require the color of the light blue sub-pixel B2 (the dark blue sub-pixel B1 is turned off), the first sub-pixel group 201, the second sub-pixel group 202 and the light blue sub-pixel B2 are turned on for displaying the first pixel 211 and the second pixel 212. At this time, the light blue sub-pixel B2 simultaneously colors the first pixel 211 and the second pixel 212, and the luminance of the light blue sub-pixel B2 is a reference value. The reference value is an average value of the luminance of the light blue sub-pixel B2 colored individually for the first pixel 211 and the luminance of the light blue sub-pixel B2 colored individually for the second pixel 212.

Alternatively, when both the first pixel 211 and the second pixel 212 require the color of the dark blue sub-pixel B1 (the light blue sub-pixel B2 is turned off), the first sub-pixel group 201, the second sub-pixel group 202 and the dark blue sub-pixel B1 are turned on for displaying the first pixel 211 and the second pixel 212. At this time, the dark blue sub-pixel B1 simultaneously colors the first pixel 211 and the second pixel 212, and the luminance of the dark blue sub-pixel B1 is a reference value. The reference value is an average value of the luminance of the dark blue sub-pixel B1 colored individually for the first pixel 211 and the luminance of the dark blue sub-pixel B1 colored individually for the second pixel 212.

Figure 1:
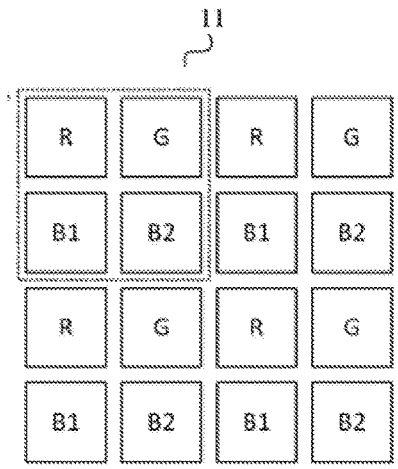
FIG. 1 is a schematic diagram of a pixel arrangement structure in the conventional technology.

Specifically, continue referring to FIG. 1, the order of arrangement of the sub-pixel in the first sub-pixel group 201 and the second sub-pixel group 202 can be the same (i.e., the order of the red sub-pixel and the green sub-pixel). In other words, the first red sub-pixel R1 and the second red sub-pixel R2 can be located on the same row. It is to be understood that the first green sub-pixel G1 and the second green sub-pixel G2 are located on the same row at this time. The order of arrangement of the dark blue sub-pixel B1 and the light blue sub-pixel B2 can be arranged in the order illustrated in FIG. 1, or the dark blue sub-pixel 131 and the light blue sub-pixel B2 can be interchange its position to be arranged. And is not limited thereto.

Figure 3:
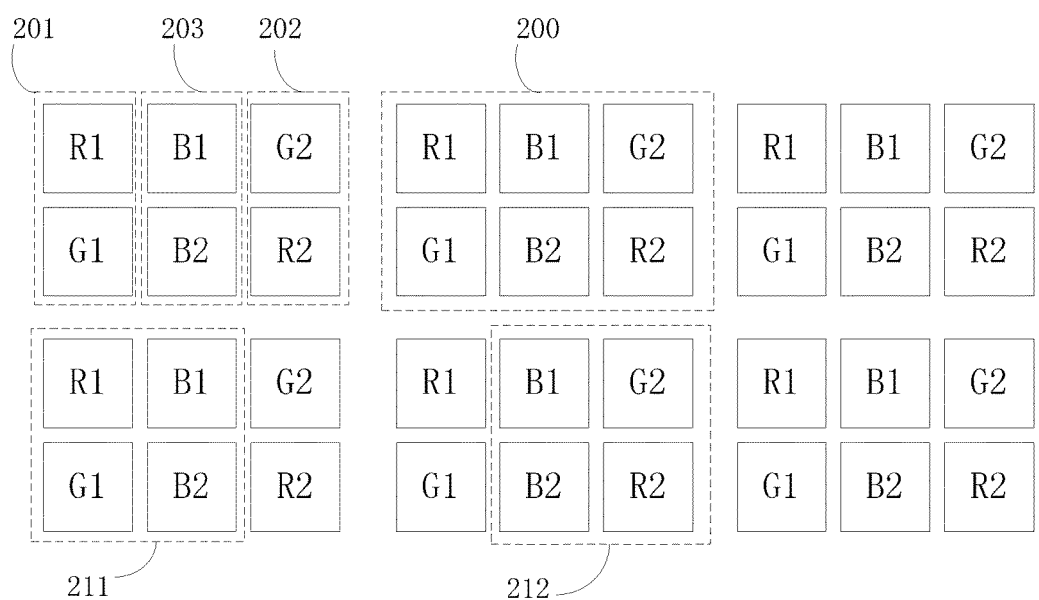
FIG. 3 is a schematic diagram of a pixel arrangement structure according another embodiment of the present invention.

Referring to FIG. 3, FIG. 3 is a schematic diagram of a pixel arrangement structure according to another embodiment of the present invention. In this embodiment, the order of arrangement of the sub-pixel in the first sub-pixel group 201 and the second sub-pixel group 202 can be not the same. In other words, the first red sub-pixel R1 and the second green sub-pixel G2 can be located on the same row. It is to be understood that the first green sub-pixel G1 and the second red sub-pixel R2 are located on the same row at this time. The order of arrangement of the dark blue sub-pixel B1 and the light blue sub-pixel B2 can be arranged in the order illustrated in FIG. 1, or the dark blue sub-pixel B1 and the light blue sub-pixel B2 can be interchange its position to be arranged. And is not limited thereto.

The invention also provides a display apparatus includes a plurality of the same pixel units 200 as described in the embodiment mentioned above, the plurality of pixel units 200 is arranged according to the pixel arrangement described according to any one of the embodiments described above. With this arrangement of pixels arrangement structure makes two pixels in the same pixel unit share a set of common sub-pixel group, which can increase the density of the sub-pixel arrangement, thereby increasing the resolution of the display apparatus.

It is to be understood that the display apparatus can be applied to any electronic device including but not limited to a mobile phone, a tablet computer, a television set, a display, a notebook computer, a digital photo frame, a navigator and others having a display function.

In the description of the specification, reference to the terms "one embodiment", "some embodiments", "examples", "specific examples", "some examples" and the like is meant to refer to a particular feature described in connection with the embodiment or example, Structures, materials, or characteristics are included in at least one embodiment or example of the present invention. In the present specification, a schematic representation of the above terms does not necessarily refer to the same embodiment or example. Moreover, the particular features, structures, materials, or characteristics described may be combined in any one or more embodiments or examples in a suitable manner.

Above are embodiments of the present application, which does not limit the scope of the present application. Any modifications, equivalent replacements or improvements within the spirit and principles of the embodiment described above should be covered by the protected scope of the invention.

What is claimed is:

1. A pixel arrangement structure comprising a plurality of pixel units, the pixel units comprising a first sub-pixel group, a common sub-pixel group, and a second sub-pixel group sequentially arranged in row direction, the first sub-pixel group comprising a first red sub-pixel and a first green sub-pixel arranged in a column direction, the common sub-pixel group comprising a dark blue sub-pixel and a light blue sub-pixel arranged in a column direction, the second sub-pixel group comprising a second red sub-pixel and a second green sub-pixel arranged in a column direction, the first sub-pixel group and the common sub-pixel group form a first pixel, and the second sub-pixel group and the common sub-pixel group form a second pixel.

2. The pixel arrangement structure according to claim 1, wherein one selected from two of the dark blue sub-pixel and the light blue sub-pixel, and the first sub-pixel group are turned on for displaying the first pixel; one of the dark blue sub-pixel, the light blue sub-pixel and the second sub-pixel group are turned on for displaying the second pixel.

3. The pixel arrangement structure according to claim 2, wherein the dark blue sub-pixel, the first sub-pixel group and the second sub-pixel group are turned on for displaying the first pixel and the second pixel, wherein the luminance of the dark blue sub-pixel is a reference value.

4. The pixel arrangement structure according to claim 2, wherein the light blue sub-pixel, the first sub-pixel group and the second sub-pixel group are turned on for displaying the first pixel and the second pixel, wherein the luminance of the light blue sub-pixel is a reference value.

5. The pixel arrangement structure according to claim 1, wherein the first red sub-pixel and the second red sub-pixel are located on the same row.

6. The pixel arrangement structure according to claim 1, wherein the first red sub-pixel and the second green sub-pixel are located on the same row.

7. A display apparatus comprising a plurality of pixel units, the pixel units comprising a first sub-pixel group, a common sub-pixel group, and a second sub-pixel group sequentially arranged in row direction, the first sub-pixel group comprising a first red sub-pixel and a first green sub-pixel arranged in a column direction, the common sub-pixel group comprising a dark blue sub-pixel and a light blue sub-pixel arranged in a column direction, the second sub-pixel group comprising a second red sub-pixel and a second green sub-pixel arranged in a column direction, the first sub-pixel group and the common sub-pixel group form a first pixel, and the second sub-pixel group and the common sub-pixel group form a second pixel.

8. The display apparatus according to claim 7, wherein one selected from two of the dark blue sub-pixel and the light blue sub-pixel, and the first sub-pixel group are turned on for displaying the first pixel; one of the dark blue sub-pixel, the light blue sub-pixel and the second sub-pixel group are turned on for displaying the second pixel.

9. The display apparatus according to claim 8, wherein the dark blue sub-pixel, the first sub-pixel group and the second sub-pixel group are turned on for displaying the first pixel and the second pixel, wherein the luminance of the dark blue sub-pixel is a reference value.

10. The display apparatus according to claim 8, wherein the light blue sub-pixel, the first sub-pixel group and the second sub-pixel group are turned on for displaying the first pixel and the second pixel, wherein the luminance of the light blue sub-pixel is a reference value.

* * * * *